United States Patent [19]
Bush et al.

[11] 4,453,198
[45] Jun. 5, 1984

[54] LINEAR FEEL KEYSWITCH WITH HYSTERESIS

[75] Inventors: Robert D. Bush, Coeur d'Alene, Id.; Dean S. Cowles, Spokane, Wash.

[73] Assignee: General Instrument Corporation, New York, N.Y.

[21] Appl. No.: 418,696

[22] Filed: Sep. 15, 1982

[51] Int. Cl.³ .................. H01G 5/16; H01H 3/12
[52] U.S. Cl. ................... 361/288; 200/340; 200/DIG. 1; 340/365 C
[58] Field of Search ........... 200/5 A, 159 A, 159 B, 200/159 R, 340, DIG. 1; 340/365 C; 361/288; 400/479.1

[56] References Cited

U.S. PATENT DOCUMENTS

| | | | |
|---|---|---|---|
| 3,582,594 | 6/1971 | Twyford | 200/340 |
| 3,773,997 | 11/1973 | Evans et al. | 200/159 B |
| 3,777,082 | 12/1973 | Hatley et al. | 200/159 B |
| 3,780,237 | 12/1973 | Seeger | 200/5 A |
| 3,856,998 | 12/1974 | Sims | 200/5 A |
| 3,965,399 | 6/1976 | Walker et al. | 340/365 C |
| 3,993,884 | 11/1976 | Kondur et al. | 200/340 |
| 4,090,229 | 5/1978 | Cencel et al. | 361/288 |
| 4,129,758 | 12/1978 | Gilano et al. | 200/159 B |
| 4,156,802 | 5/1979 | Gilano et al. | 200/5 A |
| 4,207,448 | 6/1980 | Furusawa et al. | 200/159 B |
| 4,274,752 | 6/1981 | Huber et al. | 340/365 C |
| 4,325,102 | 4/1982 | English | 361/288 |

*Primary Examiner*—John W. Shepperd
*Attorney, Agent, or Firm*—Barry R. Lipsitz

[57] ABSTRACT

A capacitive keyswitch utilizes an arrangement of three spring forces to provide a linear feel, hysteresis, and overtravel. A telescoping plunger assembly includes an outer plunger shaft and an inner plunger shaft slideably mounted therewithin for telescopic extension therefrom. A first spring provides a return force to maintain the keyswitch in its non-actuated condition. A switch actuator is coupled to the inner plunger shaft and includes a resilient foam pad (second spring) to provide resilient contact with a switching element when the plunger is moved to an actuated position. A third spring between the outer plunger shaft and the switch actuator urges the switch actuator, and thereby the inner plunger shaft, into its fully extended position.

8 Claims, 10 Drawing Figures

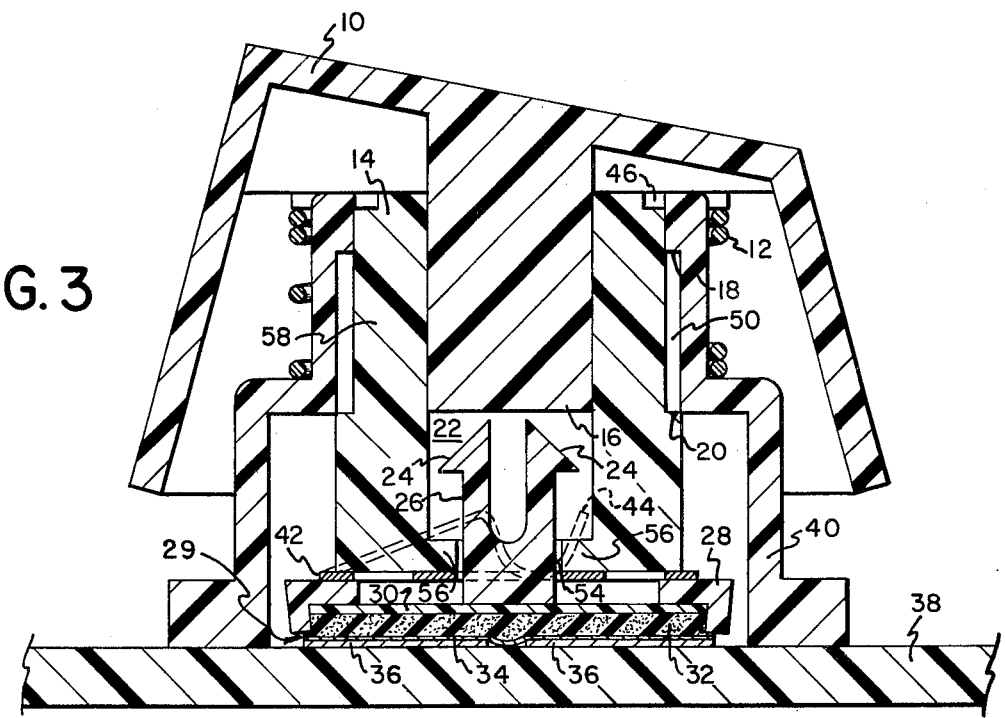
FIG. 3
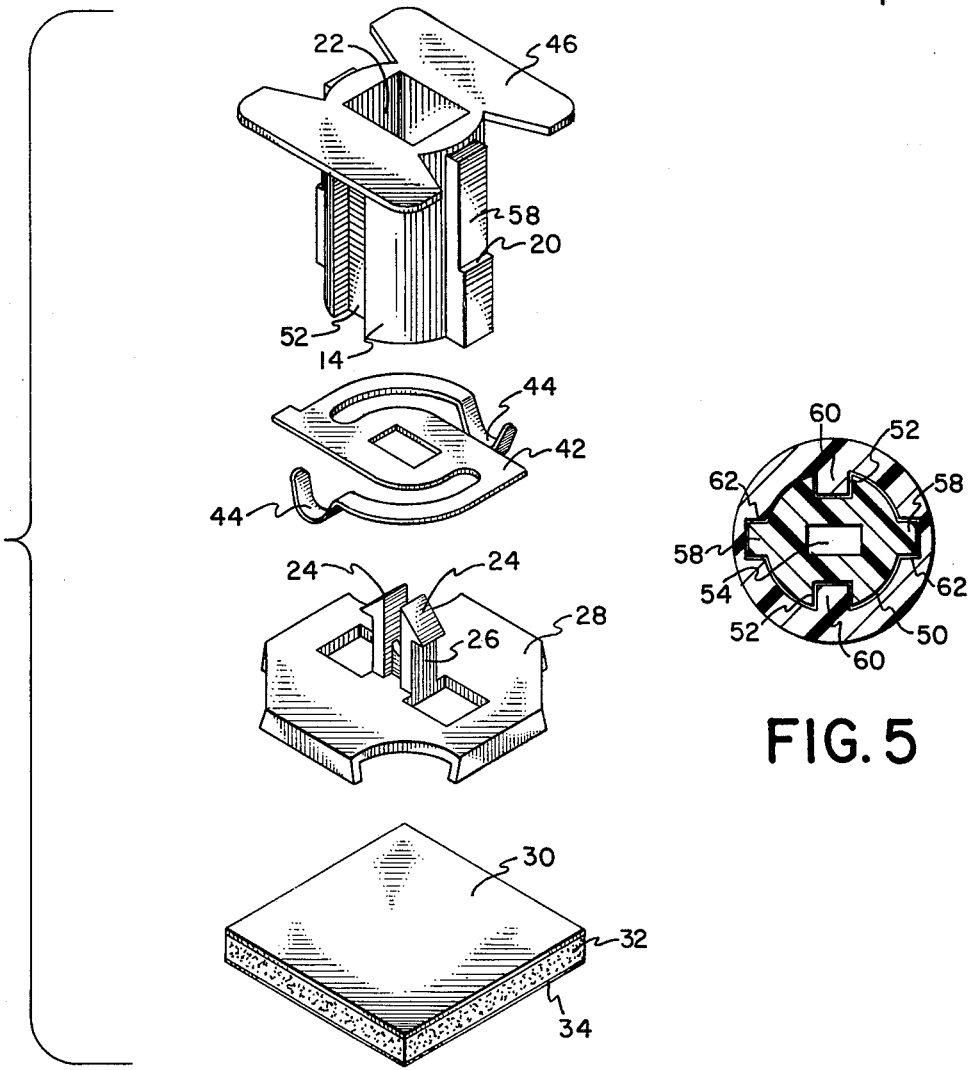
FIG. 4
FIG. 5

$$K_T = K1 + \frac{K2 \, K3}{K2+K3}$$

LINEAR FEEL KEYSWITCH WITH HYSTERESIS

BACKGROUND OF THE INVENTION

The present invention relates to keyswitches for use in computer terminals, typewriters, and the like and more particularly to an actuator assembly for use in a linear feel keyswitch with hysteresis which includes three separate spring elements.

Keyswitches of conventional design generally include a plunger which is slideably mounted within a housing. The plunger is designed to slide downwardly when the keytop of the keyswitch is pressed. Downward pressure on the keytop actuates an electrical switch coupled to the plunger.

For certain applications, it is desirable to have a keyswitch which provides a linear feel to the keyswitch operator. It is also desirable to provide a keyswitch with hysteresis and overtravel.

In a keyswitch with linear feel, the amount of force required to press the switch from its non-actuated to its fully depressed condition increases linearly as the plunger travels downwardly. In a keyboard, such as a typewriter keyboard manufactured from a plurality of keyswitches, the provision of linear feel reduces fatigue on the fingers of the keyboard operator. The use of linear feel keyswitches also increases accuracy by providing a certain degree of feedback to the keyboard operator and facilitates the efficiency of keyboard operation.

The provision of hysteresis in a keyswitch results in a lag in the electrical response of the switch. For example, if the point at which a keyswitch "makes" an electrical connection on the downward stroke of the plunger is further down than the point at which the electrical connection "breaks" on the upward stroke, the switch is said to have a positive hysteresis. If the make and break points in the switch are at the exact same physical location on the downward and upward strokes (i.e., no hysteresis), it will be possible for a keyswitch operator to unintentionally produce multiple actuations if any hesitation is made at the exact moment the switch turns on. This phenomenon is known as "teasing" the switch, because what is intended by the operator as one switch actuation may be interpreted by the circuitry actuated by the switch as a plurality of actuations. Where the switch is designed such that it must pass through the make point on its return stroke before the break point is reached, such teasing, with the resultant possibility of error, will be prevented.

Hysteresis can be provided by either electrical means, mechanical means, or both. For example, hysteresis can be provided electrically in a capacitive-type keyboard by using an electronic circuit with different thresholds for "make" and "break" to detect the keyboard output. If the electronic circuit senses an incremental change in capacitance of 8 picofarads ("pf") from a threshold value as a make condition and an incremental capacitance change of 5 pf from the same threshold value as a break condition, then the plungers of the keyswitches on the keyboard will have to pass through the make point on their return stroke before reaching the break point. Thus, positive hysteresis will be achieved.

Mechanical hysteresis can be provided by mechanically establishing a different plunger displacement for the make point and the break point. It has now been found that the use of a plunger using three spring elements, where one spring element is a resilient foam switch actuator, provides a significantly improved positive mechanical hysteresis. This result occurs even though the resilient foam itself has a force versus displacement profile indicative of a negative hysteresis. Spring elements other than resilient foam, which exhibit negative hysteresis, can alternatively be used. For example, a plunger having two spring elements, in conjunction with the spring force provided by a momentary contact membrane-type keyswitch well known in the art, can provide an improved positive mechanical hysteresis in accordance with the present invention. In such an arrangement, the plunger with two spring elements would be used to actuate the membrane-type switch.

In a keyswitch with overtravel, electrical contact is made (i.e., the switch turns "on") before the keytop is fully depressed. Overtravel provides for more reliable switch operation, because keyboard operators often inadvertently fail to press the keyswitch down the whole way, particularly when typing at a high rate of speed. When overtravel is provided, the keyswitch will turn on as long as the plunger is depressed at least to the point where electrical contact is made.

It would be advantageous to provide a keyswitch combining the favorable characteristics of linear force, hysteresis, and overtravel. The present invention relates to such a keyswitch.

SUMMARY OF THE INVENTION

An actuator assembly for use in a keyswitch is provided which comprises a plunger and first spring means for urging the plunger into a non-actuated position. A switch actuator is extendibly coupled to the plunger. A second spring means provides resilient contact with a switching element when the plunger is moved to an actuated position. Third spring means between the plunger and the switch actuator urges the switch actuator into an extended position.

The actuator assembly provides a linear feel, hysteresis, and overtravel. The resilient contact provided by the second spring means exhibits a negative hysteresis. However, this negative hysteresis is favorably overcome by the combined forces of the first and third spring means to provide an overall positive hysteresis, with linear feel. The extendible switch actuator arrangement provides desired overtravel and, when used in a low-profile keyswitch embodiment, a feel which is similar to the full travel feel of a conventional full size keyswitch.

BRIEF DESCRIPTION OF THE DRAWINGS

FIG. 2 is a cross-sectional view of the keyswitch shown in FIG. 1, which is pressed down to just before the point at which the switch turns on;

FIG. 3 is a cross-sectional view of the keyswitch shown in FIGS. 1 and 2, when it is fully depressed;

FIG. 4 is an exploded view of the plunger assembly of the present invention;

FIG. 5 is a plan view taken substantially along the line 5—5 of FIG. 1, which has been simplified to show the rib and channel arrangement of the outer plunger shaft within the keyswitch housing;

DETAILED DESCRIPTION OF THE INVENTION

Figure 1:
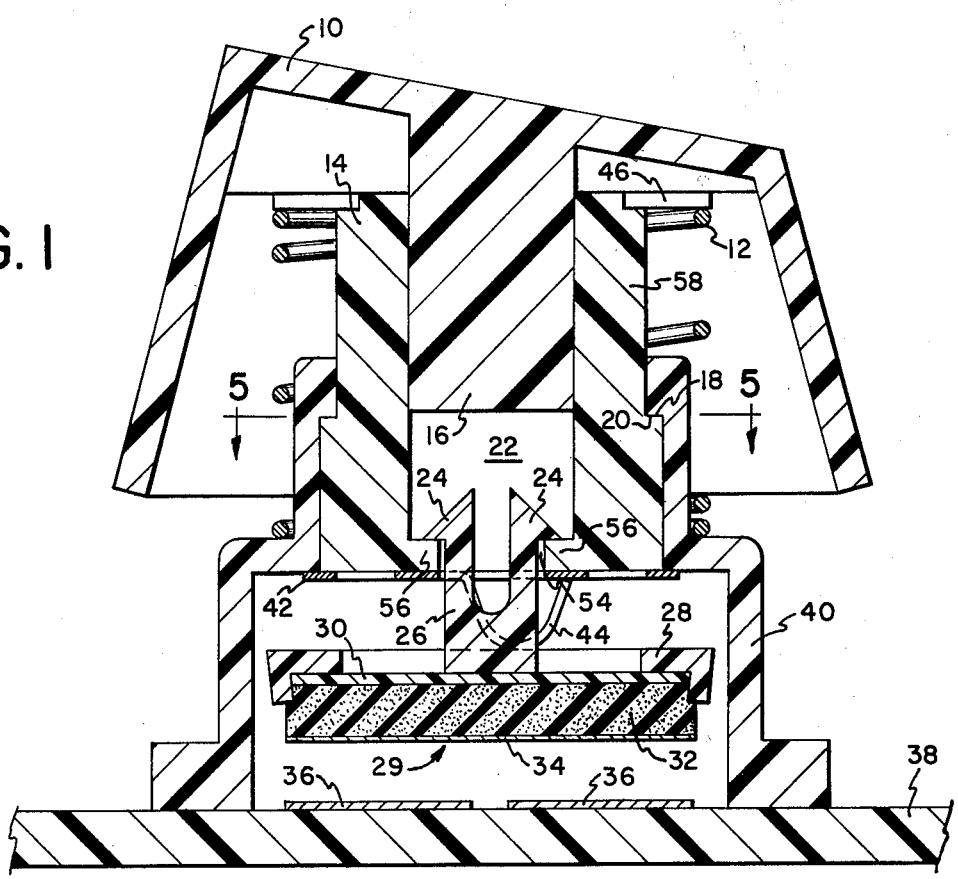
FIG. 1 is a cross-sectional view of a keyswitch in accordance with the present invention in its normal, non-depressed state.

FIG. 1 shows the construction of a keyswitch in accordance with the present invention. The keyswitch includes a housing 40 which has a channel 50 therein (see FIG. 2) through which a telescoping plunger comprising an outer plunger shaft 14 and an inner plunger shaft 26 passes. Outer plunger shaft 14 is arranged so that it can slide within channel 50. One end of outer plunger shaft 14 includes a flange 46 against which one end of a return spring 12 provides a force in an upward direction. The other end of spring 12 bears against a portion of housing 40. When the keyswitch is not actuated, spring 12 maintains the switch in its non-depressed (turned-off) position. Spring 12 is prevented from pushing outer plunger shaft 14 completely out of channel 50 by a shoulder 20 on outer plunger shaft 14 which abuts with a corresponding shoulder 18 in housing 40.

Outer plunger shaft 14 has a generally hollow center 22 into which stud 16 of a keytop 10 is press fit. Keytop 10 is angled so that when a plurality of such switches are used to fabricate a keyboard, the keytops are angled toward the keyboard operator.

Inner plunger shaft 26 is mounted in telescoping relation with outer plunger shaft 14. One end of inner plunger shaft 26 is retained within the channel 22 of outer plunger shaft 14 through the use of a pair of resilient tapered tabs 24. The arrangement of tabs 24 within channel 22 provides an articulating joint between inner plunger shaft 26 and outer plunger shaft 14, so that an actuating assembly (described hereinafter) attached to inner plunger shaft 26 will be self-leveling. In assembling the telescoping plunger, tabs 24 are pushed into a hole 54 and snap over a shoulder 56 at one end of outer plunger shaft 14. Tabs 24 thereby serve as a retaining means and define the maximum extension of inner plunger shaft 26 from outer plunger shaft 14. A spring 42, most clearly shown in FIG. 4, is provided between outer plunger shaft 14 and a rigid retaining plate 28 which is attached to inner plunger shaft 26. Spring 42 includes a plurality of spring fingers 44 cut therefrom which protrude beyond the flat surface of spring 42. Spring 42 thereby biases the telescoping plunger into its fully extended position. Retaining plate 28 holds a capacitive switch actuator assembly comprising a plastic plate 30, resilient foam pad 32, and metalized foil 34 which can comprise metalized mylar. Plastic plate 30 snaps into and is retained by rigid retaining pad 28.

The keyswitch is mounted on a printed circuit board 38 which contains a switching element 36. In the embodiment shown in the figures, the keyswitch is a capacitive type switch in which the change in position of metalized foil layer 34 serves to change the capacitance across switching element 36. Switching element 36 comprises two conductive plates which, in conjunction with metalized foil layer 34, form a pair of series connected capacitors. The change in capacitance which occurs when foil layer 34 is brought adjacent plates 36 is sensed by electronic circuitry (not shown) to indicate an actuation, or turning on, of the keyswitch. Electrical hysteresis can be provided by the electronic circuitry. For example, if the electrical circuitry detects 8 pf as a make condition (on the down stroke of outer plunger shaft 14) and 5 pf as a break condition (on the return stroke of outer plunger shaft 14) positive electrical hysteresis will be achieved. Those skilled in the art will appreciate that different types of actuators for different types of switching mechanisms can alternatively be attached to inner plunger shaft 26, as long as resilient foam pad 32 or equivalent spring means is present to provide the desired mechanical hysteresis as explained hereinbelow. For example, the combination of outer plunger shaft 14 and inner plunger shaft 26 in housing 40 with springs 12 and 42 can be mounted above a momentary contact switching element, e.g., a membrane-type switch, on a circuit board to actuate the switching element. The inherent return spring force of the momentary contact switching element will provide a force equivalent to that of resilient foam pad 32.

Figure 2:
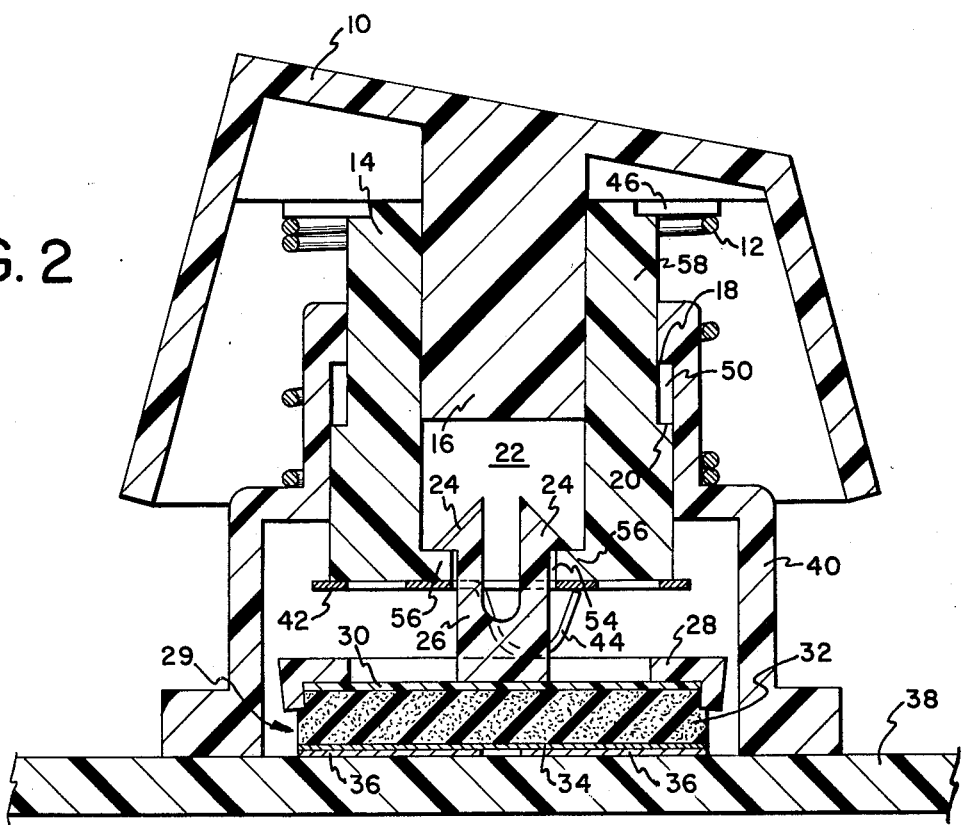

FIG. 2 shows the switch of FIG. 1 when keytop 10 has been pressed down just to the point at which switch actuating assembly 29 contacts switching element 36 on circuit board 38. As can be seen, at the point of contact, outer plunger shaft 14 has slid from a first position shown in FIG. 1 to an intermediate position, causing spring 12 to compress. Inner plunger shaft 26 remains fully extended with respect to outer plunger shaft 14, and spring 42 therefore remains in its uncompressed normal state.

FIG. 3 shows the keyswitch of FIGS. 1 and 2 in its fully depressed state. As shown, inner plunger shaft 26 is collapsed within hollow 22 of outer plunger shaft 14. As a result, spring 42 is compressed with protruding fingers 44 having been deflected upwardly. Foam pad 34 also compresses when the keyswitch is fully depressed. The combination of springs 12, 42, and the inherent spring constant of foam pad 32 combine to increase the hysteresis of the keyswitch. For the purposes of this disclosure, and the claims appended hereto, resilient foam pad 32 is considered to be a "spring".

Figure 6:
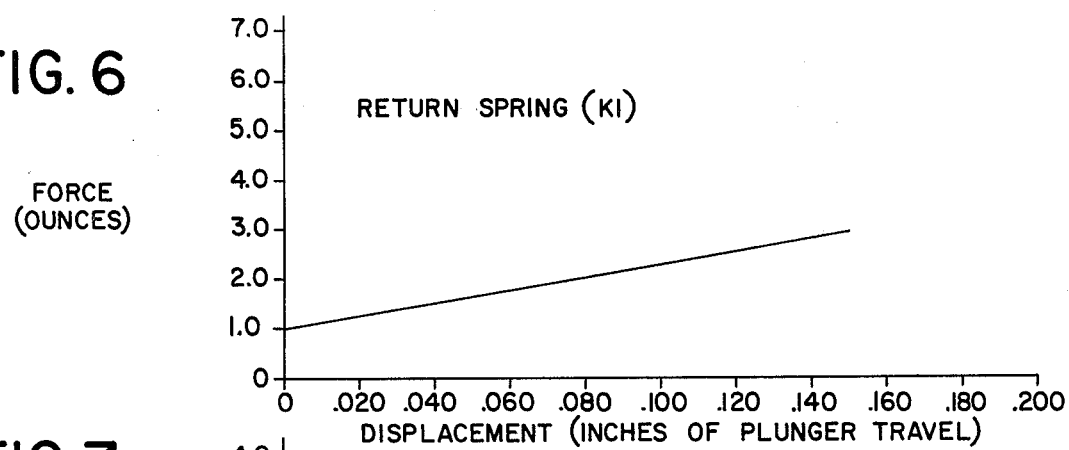
FIG. 6 is a force versus displacement profile of return spring 12.

It has been found that by combining springs 12, 42 and resilient foam pad 32, not only is the hysteresis of the keyswitch improved, but a substantially linear force versus displacement profile is achieved. This result can best be understood by reference to FIGS. 6 through 10. FIG. 6 shows the force versus displacement profile of return spring 12 alone. The vertical axis represents force (in ounces) and the horizontal axis represents the downward displacement of the keyswitch plunger shaft 14 (in inches) from its normal, non-depressed condition. This spring has a spring constant $K_1$ which, as shown, has an operating range between 0.000 inches through 0.150 inches of downward displacement where the force applied to the spring is linear.

Figure 7:
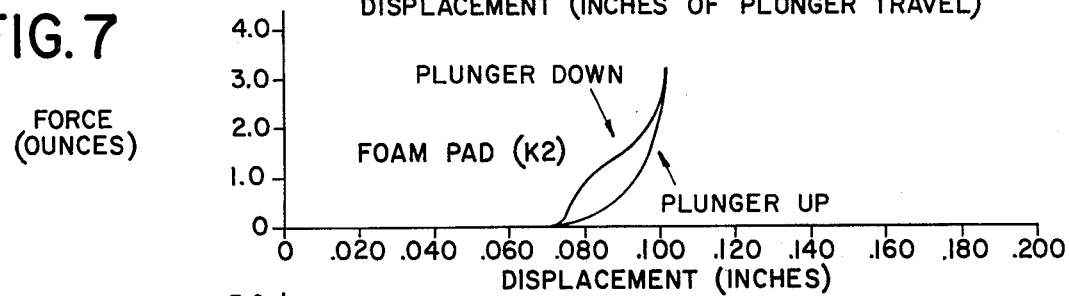
FIG. 7 is a force versus displacement profile of resilient foam pad 32.

FIG. 7 shows the response of foam pad 32, again with force on the vertical axis and displacement on the horizontal axis. As can be seen, foam pad 32 exhibits a negative hysteresis whereby the force is the same for different displacements depending upon whether the plunger shaft is being pressed down or is on its return stroke. Foam pad 32 has a spring constant designated $K_2$, and has the tendency to conform to the shape of anything which it is pressed against. Further, the foam, which is typically fabricated from urethane foam, has a "memory" such that when a pressure against it is released, it maintains its collapsed or conformed shape for a short period of time. It is believed that the characteristic of the foam to conform, along with its memory, is responsible for the negative hysteresis shown in FIG. 7.

Figure 8:
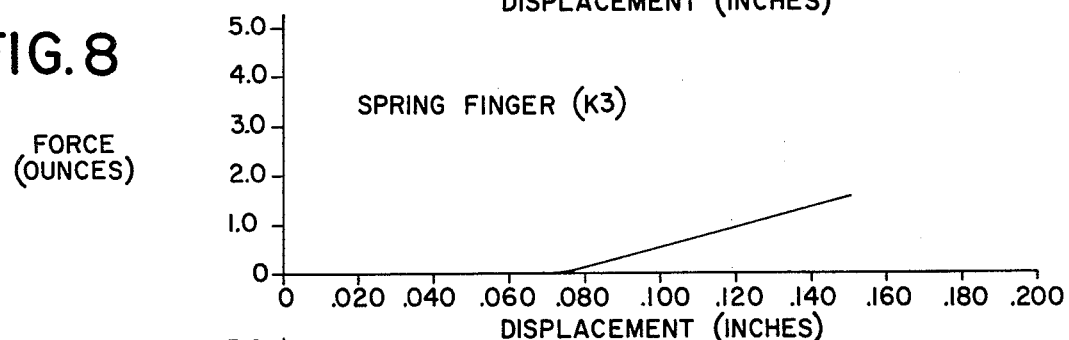
FIG. 8 is a force versus displacement profile of spring 42.

FIG. 8 shows the force versus displacement profile of spring 42, which has a spring constant $K_3$. As can be seen, this spring has a linear section from about 0.070 through 0.150 inches of displacement. As spring 42 does not begin to compress until after foam pad 32 bears against circuit board 38, there is no force on this spring until the outer plunger shaft 14 has traveled approximately 0.070 inches, as shown in FIG. 8.

Figure 9:
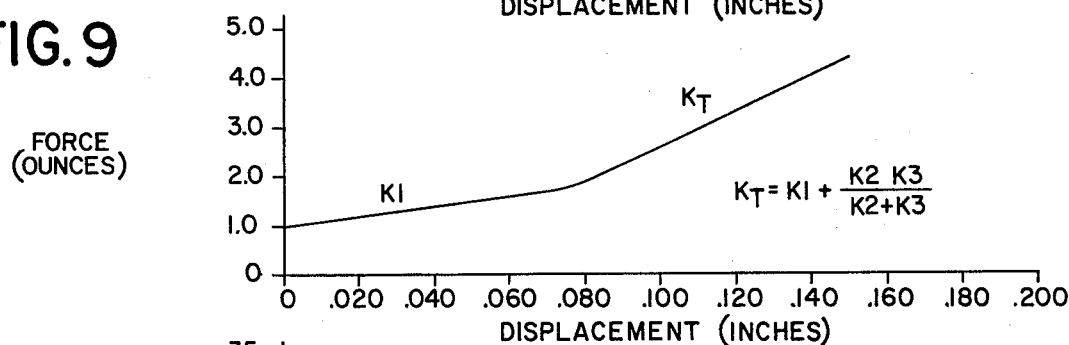
FIG. 9 is a combined force versus displacement profile of the springs individually profiled in FIGS. 6, 7 and 8.

FIG. 9 is a combined force vs. displacement profile for the keyswitch shown in FIGS. 1 through 3. The total spring constant $K_T$ of springs 12, 42 and 32, which occurs after foam pad 32 bears against circuit board 38 at 0.070 inches of plunger travel, is $K_T = K_1 + K_2 K_3 / (K_2 + K_3)$. As this equation confirms, the arrangement of these springs is effectively a series - parallel one, where spring 12 is in series with the parallel arrangement of springs 42 and 32. As can be seen, the overall profile is essentially linear with a slight knee occuring at the point at which the foam pad 32 begins to bear against circuit board 38. This knee occurs at approximately 0.070 inches of plunger displacement.

Figure 10:
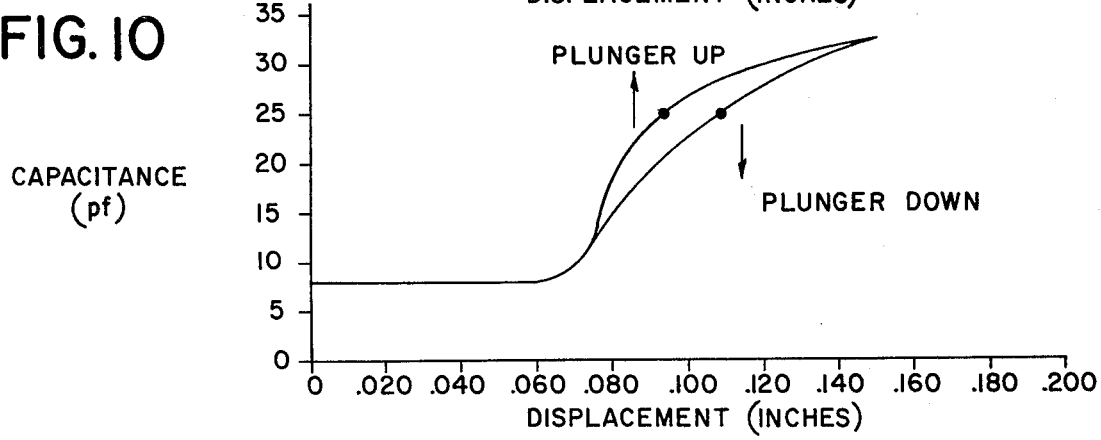
FIG. 10 is a capacitance versus displacement profile of a keyswitch in accordance with the present invention.

The capacitance versus displacement curve for a keyswitch in accordance with the present invention is shown in FIG. 10. This curve clearly shows the positive hysteresis which is present in the keyswitch. As can be seen, on its downward stroke the keyswitch has a capacitance of 25 pf when the total displacement of plunger shaft 14 is approximately 0.109 inches. On the return (upward) stroke a 25 pf capacitance occurs at approximately 0.093 inches. Thus, if the switching point of the keyswitch is set at 25 pf, the switch will turn on at 0.109 inches of displacement on the downward stroke, and remain on until the plunger shaft 14 has passed back through the point of 0.093 inches of displacement on the return stroke. This positive hysteresis is desirable, and an inherent feature of the present invention.

As noted above, foam pad 32 has a metalized foil 34 secured thereto. The surface of foam pad 32, and hence foil 34, is irregular when the foam is in its uncompressed state. When the foam and foil are pressed against switching element 36, the foam collapses, and the surfaces of the foam and foil smooth out increasing their effective area of contact with the capacitor plates forming switching element 36.

When the keyswitch is released, so that the foam pad 32 and foil 34 retract from their position against switching element 36, the spring 42 maintains a force on the foam pad so that the foam and foil surfaces stay smooth. These surfaces are maintained by the action of spring 42 in their smooth condition until they are completely free from switching element 36. Thus, while foam pad 32 and metalized foil 34 are wrinkled when they first meet switching element 36, they come back off of swiching element 36 in a flat, parallel manner. The foam and foil do not wrinkle again until after they are entirely free. It is believed that the irregular surface of the foam and foil on the downward stroke of the keyswitch, and the smooth surface on the upward stroke, accounts for the hysteresis of the keyswitch shown in FIG. 10.

The provision of overtravel in the keyswitch of the present invention can be best understood by comparing FIG. 2 to FIG. 3. In FIG. 2, switch actuator assembly 29 has just made contact with switching element 36.

Interior plunger shaft 26 is still fully extended from outer plunger shaft 14. For a capacitive type keyswitch as shown in the figures, the switch will turn on just past the point at which actuator assembly 29 makes contact with switching element 36. Continued downward pressure on keytop 10 causes inner plunger shaft 26 to collapse into the hollow portion 22 of outer plunger shaft 14. This collapse, or telescoping action provides the desired overtravel. Additional overtravel is provided when foam pad 32 compresses.

FIG. 4 is an exploded view of the telescoping plunger assembly. Inner plunger shaft 26, which extends from rigid pad retainer 28 contains resilient tapered tabs 24 which snap into outer plunger shaft 14. Spring 42 is sandwiched between outer plunger shaft 14 and rigid pad retainer 28. Plate 30 carrying foam pad 32 and metalized foil 34 snaps into rigid pad retainer 28.

Ribs 58 are provided on outer plunger shaft 14, along with grooves 52 in order to provide a favorable length to width ratio for the plunger bearing surfaces, resulting in a smooth sliding action when the plunger is depressed. The ribs and groove arrangement also prevent the plunger from rotating within housing 40. As shown in FIG. 5, housing 40 contains grooves 62 which correspond to ribs 58, and contains ribs 60 which correspond to grooves 52. Those skilled in the art will appreciate that other configurations of ribs and grooves can be used to provide the desired smooth plunger operation and to prevent rotation of the plunger within the housing.

We claim:

1. An actuator assembly for use in a keyswitch comprising:
   a plunger;
   first spring means having a substantially linear spring constant for urging said plunger into a non-actuated position;
   a switch actuator extendibly coupled to said plunger; said switch actuator including
   second spring means comprising a resilient pad having a non-linear spring constant for providing resilient contact with a switching element when said plunger is moved to an actuated position; and
   third spring means having a substantially linear spring constant between said plunger and said switch actuator for urging said switch actuator into an extended position,
   said first, second and third spring means cooperating to provide said actuator assembly with a linear force versus displacement characteristic.

2. The assembly of claim 1 wherein said resilient pad comprises foam.

3. The assembly of claim 2 further comprising a metalized foil secured to said foam pad for actuation of a capacitive type switching element.

4. A linear feel keyswitch assembly with hysteresis for mounting over a switching element on a circuit board comprising:
   a housing;
   first and second springs having substantially linear spring constants $K_1$ and $K_3$ respectively;
   a plunger which is spring loaded by said first spring into a first position within said housing;
   a switch actuator extendibly mounted to said plunger and spring loaded by said second spring into its fully extended position from said plunger; and
   spring means coupled to said switch actuator and having a non-linear spring constant $K_2$ for providing resilient contact with a switching element when said plunger is moved to an actuated position;

whereby the total spring constant $K_T$ of said linear feel keyswitch assembly satisfies the equation $$K_T = K_1 + K_2 K_3/(K_2 + K_3).$$

5. The keyswitch of assembly of claim 4 wherein said spring means having spring constant $K_2$ comprises a resilient foam pad.

6. The keyswitch assembly of claim 5 wherein said second spring comprises a substantially flat piece of spring material sandwiched between said plunger and said switch actuator and having a plurality of spring fingers cut therefrom with portions of said fingers protruding beyond the flat surface of said piece.

7. The keyswitch assembly of claim 6 wherein said first spring comprises a spiral spring surrounding said plunger and bearing at one end thereof against said housing and at the other end thereof against a flange extending from said plunger.

8. The keyswitch assembly of claim 7 further comprising a metalized foil secured to said foam pad for actuation of a capacitive type switching element.

* * * * *